United States Patent
Inoue et al.

(10) Patent No.: US 9,601,633 B2
(45) Date of Patent: *Mar. 21, 2017

(54) SEMICONDUCTOR DEVICE

(71) Applicant: Semiconductor Energy Laboratory Co., Ltd., Atsugi-shi, Kanagawa-ken (JP)

(72) Inventors: Takayuki Inoue, Kanagawa (JP); Masashi Tsubuku, Kanagawa (JP); Suzunosuke Hiraishi, Kanagawa (JP); Junichiro Sakata, Kanagawa (JP); Erumu Kikuchi, Kanagawa (JP); Hiromichi Godo, Kanagawa (JP); Akiharu Miyanaga, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/330,113

(22) Filed: Jul. 14, 2014

(65) Prior Publication Data
US 2014/0319519 A1    Oct. 30, 2014

Related U.S. Application Data

(62) Division of application No. 13/048,023, filed on Mar. 15, 2011, now abandoned.

(30) Foreign Application Priority Data

Mar. 19, 2010 (JP) ................................ 2010-064751

(51) Int. Cl.
*H01L 29/10* (2006.01)
*H01L 29/12* (2006.01)
(Continued)

(52) U.S. Cl.
CPC .......... *H01L 29/7869* (2013.01); *H01L 29/24* (2013.01); *H01L 29/41733* (2013.01);
(Continued)

(58) Field of Classification Search
CPC ............ H01L 29/7869; H01L 27/1225; H01L 21/02565
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Jesse Y Miyoshi
(74) *Attorney, Agent, or Firm* — Fish & Richardson P.C.

(57) ABSTRACT

An oxide semiconductor layer in which "safe" traps exist exhibits two kinds of modes in photoresponse characteristics. By using the oxide semiconductor layer, a transistor in which light deterioration is suppressed to the minimum and the electric characteristics are stable can be achieved. The oxide semiconductor layer exhibiting two kinds of modes in photoresponse characteristics has a photoelectric current value of 1 pA to 10 nA inclusive. When the average time $\tau_1$ until which carriers are captured by the "safe" traps is large enough, there are two kinds of modes in photoresponse (Continued)

characteristics, that is, a region where the current value falls rapidly and a region where the current value falls gradually, in the result of a change in photoelectric current over time.

8 Claims, 9 Drawing Sheets

(51) Int. Cl.
  *H01L 29/786* (2006.01)
  *H01L 29/417* (2006.01)
  *H01L 29/24* (2006.01)
  *H01L 31/032* (2006.01)
  *H01L 31/18* (2006.01)
  *H01L 27/12* (2006.01)

(52) U.S. Cl.
  CPC ............ *H01L 31/032* (2013.01); *H01L 31/18* (2013.01); *H01L 27/1225* (2013.01)

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 7,935,582 B2 | 5/2011 | Iwasaki | |
| 7,956,361 B2 | 6/2011 | Iwasaki | |
| 8,035,128 B2 * | 10/2011 | Ikeda ................ H01L 29/66462 257/192 | |
| 8,154,024 B2 | 4/2012 | Iwasaki | |
| 8,207,014 B2 * | 6/2012 | Sasaki ................ H01L 29/7869 257/E21.411 | |
| 8,232,552 B2 | 7/2012 | Yano et al. | |
| 8,274,078 B2 | 9/2012 | Itagaki et al. | |
| 8,642,402 B2 | 2/2014 | Yano et al. | |
| 8,785,240 B2 | 7/2014 | Watanabe | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0063211 A1 | 3/2007 | Iwasaki | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 * | 3/2010 | Tokunaga ......... H01L 29/78606 257/43 | |
| 2010/0084648 A1 * | 4/2010 | Watanabe ......... H01L 29/66969 257/43 | |
| 2010/0092800 A1 | 4/2010 | Itagaki et al. | |
| 2010/0109002 A1 | 5/2010 | Itagaki et al. | |

FOREIGN PATENT DOCUMENTS

| | | |
|---|---|---|
| EP | 2339639 A | 6/2011 |
| EP | 2816607 A | 12/2014 |
| JP | 60-198861 A | 10/1985 |
| JP | 63-210023 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 1/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |

(56) References Cited

FOREIGN PATENT DOCUMENTS

| | | |
|---|---|---|
| JP | 2004-273614 A | 9/2004 |
| JP | 2004-273732 A | 9/2004 |
| JP | 2006-165528 A | 6/2006 |
| JP | 2007-103918 A | 4/2007 |
| JP | 2007-311404 A | 11/2007 |
| JP | 2008-243928 A | 10/2008 |
| JP | 2008-281988 A | 11/2008 |
| JP | 2009-099847 A | 5/2009 |
| JP | 2009-275236 A | 11/2009 |
| WO | WO-2004/114391 | 12/2004 |
| WO | WO-2007/029844 | 3/2007 |
| WO | WO-2008/096768 | 8/2008 |
| WO | WO-2008/133345 | 11/2008 |

OTHER PUBLICATIONS

Meibooms et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1. 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al: B: Mg, Mn, Fe, Ni, Cu or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Clystal Data of Homologous Compounds, In2O3(ZnO)m (m=3, 4, and 5). InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116. No. 1. pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17. 1996, vol. 68, No. 25, pp. 3650-3652.

Li.C et al., "Modulated Structures of Homologous Compounds InMO3(ZnO)m (M=In,Ga; m=Integer) Described by Four-Dimensional Superopace Group", Journal of Solid State Chemistry, 1998, vol. 139, pp. 347-355.

Kikuchi.H et al. "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004. vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432. pp. 488-492.

Dembo.H et al, "RFCPUs on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H. et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M. "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUs on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Drivers by Indium-Gallium-Zinc Oxide TFTs Array", SID Digest '08 : SID International Symposium Digest of Technical Papers, May 20, 2008, vol. 39, No. 1 , pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5') Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

(56) References Cited

OTHER PUBLICATIONS

Godo.H et al., "P-9:Numerical Analysis on Temperature Dependence of Characteristics of Amorphous In—Ga—Zn-Oxide TFT". SID Digest '09: SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure"; IEDM 09: Technical Digest of International Electron Devices Meeting. Dec. 7. 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5. pp. 1012-1015.

Orita.M et al., "Amorphous transparent conductive oxide InGaO3(ZnO)m (m <4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 58, pp. 4303-4308.

Janotti.A et al., "Native Point Defects in ZnO", Phys. Rev. B (Physical Review. B), Oct. 4, 2007, vol. 76, No. 16, pp. 165202-1-166202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium: Zinc Oxide Thin-Film Transistors by Ar Plasma Treatment", Appl. Phys. Lett. (Appled Physics Letters), Jun. 26, 2007, vol. 90, No. 26, pp. 282106-1-262106-3.

Park.J et al., "Electronic Transport Properties of Amorphous Indium-Galium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B.), 2008, vol. 77, pp. 245202-1-245202-6.

Kim.S et al., "High-Performance oxide thin film transistors passivated by various gas plasmas", 214th ECS Meeting, 2006, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Dispiay", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2343.

Masuda.S et al., "Transparent thin-film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J. et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystaline InGaO3(ZnO)5 films". Appl. Phys. Lett. (Applied Physics Letters), Sep. 13, 2004, vol. 85, No. 11, pp. 1993-1995.

Lee.D et al., "Large Photoresponse in Amorphous In—Ga—Zn—O and Origin at Reversible and Slow Decay", Electrochemical and Solid-State Letters, 2010, vol. 13, No. 9, pp. H324-H327.

Ghaffarzadeh.K et al, "Persistent photoconductivity in Hf—In—Zn—O thin film transistors". Appl. Phys. Lett. (Applied Physics Letters), 2010, vol. 97, No. 14, pp. 143510-1-143510-3.

Oh.H et al., "Photon-accelerated negative bias instabiiity involving subgap states creation in amorphous In—Ga—Zn—O thin film transistor", Appl. Phys. Lett. (Applied Physics Letters), 2010, vol. 97, No. 17, pp. 183502-1-183502-3.

Tsubuku.M et al., "Photo-Current Response and Negative Bias Stability Under Light Irradiation in IGZO-TFT". IDW '10 : Proceedings of the 16th International Display Workshops, Dec. 1, 2010, pp. 1841-1844.

Lee.D et al., "Steady-state photoconductivity of amorphous In—Ga—Zn—O", Thin Solid Films, Mar. 31, 2010, vol. 518, No. 11, pp. 3000-3003.

* cited by examiner

SEMICONDUCTOR DEVICE

CROSS-REFERENCE TO RELATED APPLICATIONS

This application is a divisional of U.S. application Ser. No. 13/048,023, filed Mar. 15, 2011, now pending, which claims the benefit of a foreign priority application filed in Japan as Serial No. on 2010-064751, on Mar. 19, 2010, both of which are incorporated by reference.

BACKGROUND OF THE INVENTION

1. Field of the Invention

One of embodiments of the present invention relates to a semiconductor element such as a transistor and/or a semiconductor device at least part of which is formed using the semiconductor element. For example, an active element including an oxide semiconductor is described as the semiconductor element, and a display device including the active element is described.

2. Description of the Related Art

Although transistors including amorphous silicon have been used for conventional display devices typified by liquid crystal televisions, an oxide semiconductor has attracted attention as a material which replaces a silicon semiconductor in order to form transistors. For example, an active matrix display device is disclosed, in which an amorphous oxide containing In, Ga, and Zn is used for an active layer of a transistor and the electron carrier concentration of the amorphous oxide is less than $10^{18}/cm^3$ (see Patent Document 1).

However, some problems of a transistor including an oxide semiconductor have been pointed out. One of the problems is the stability of the characteristics, and it is pointed out that the electric characteristics of the transistor are changed by irradiation with visible light and ultraviolet light.

REFERENCE

Patent Document

[Patent Document 1] Japanese Published Patent Application No. 2006-165528

SUMMARY OF THE INVENTION

An oxide semiconductor formed of a metal oxide has a band gap of about 3 eV and originally has a light-transmitting property with respect to visible light. However, it is known that a film comprising the oxide semiconductor deteriorates when being irradiated with strong light (the deterioration is called light deterioration).

Any method for improving such a change in the characteristics caused by light in a transistor including an oxide semiconductor has not been proposed, which causes a delay in practical use of the oxide semiconductor which is expected as a new material.

In addition, a backlight is used in a liquid crystal display device; when a transistor including an oxide semiconductor is irradiated with light from the backlight, for example, leakage current might be generated in an off state of the transistor owing to photoexcitation, which leads to reduction in display quality, or light deterioration might be caused.

Further, it is known that a single-layer oxide semiconductor film formed of a metal oxide has a photoelectric current value of about 10 µA.

It is an object of an embodiment of the present invention to provide a transistor in which light deterioration is suppressed to the minimum and the electric characteristics are stable.

The mechanism of photoelectric current will be described below.

Carriers in a semiconductor can be described by continuity equations. Formula 1 and Formula 2.

$$\frac{dn}{dt} = \frac{1}{q}\frac{\partial J_n}{\partial x} + (G_n - R_n) \qquad \text{[Formula 1]}$$

$$\frac{dp}{dt} = -\frac{1}{q}\frac{\partial J_p}{\partial x} + (G_p - R_p) \qquad \text{[Formula 2]}$$

Note that in the above two equations, t represents time, x represents a position, and q represents a charge. Here, n and p represent carrier density of electrons and carrier density of holes, $J_n$ and $J_p$ represent a current value of electrons and a current value of holes, $G_n$ and $G_p$ represent a generation probability of electrons and a generation probability of holes, and $R_n$ and $R_p$ represent a recombination probability of electrons and a recombination probability of holes. The number of hole carriers is divided into the number of hole carriers $p_0$ in a thermal equilibrium state and the number of hole carriers $\Delta p$ in a non-thermal equilibrium state. The carrier density of holes can be expressed by Formula 3.

$$p = p_0 + \Delta p \qquad \text{[Formula 3]}$$

When the semiconductor is irradiated with light having an energy of greater than or equal to the band gap, electrons in the valence band are transferred to the conduction band while the semiconductor absorbs the light, whereby holes are generated. When the generation probability of holes is represented by $G_{op}$, the recombination probability is expressed by Formula 4. Here, $\tau_p$ represents relaxation time of holes.

$$R = \frac{p}{\tau_p} = \frac{p_0}{\tau_p} + \frac{\Delta p}{\tau_p} \qquad \text{[Formula 4]}$$

When a device is uniformly irradiated with light, a continuity equation represented by Formula 5 is obtained if a diffusion term in a source direction or a drain direction can be ignored.

$$\frac{d(\Delta p)}{dt} = G_{op} - R = R_{op} - \frac{\Delta p}{\tau_p} \qquad \text{[Formula 5]}$$

Formula 5 is solved with an initial photoelectric current value at 0, which leads to a carrier concentration expressed by Formula 6.

$$\Delta p(t) = G_{op}\tau_p\left[1 - \exp\left(-\frac{t}{\tau_p}\right)\right] \qquad \text{[Formula 6]}$$

When the time at which a light source is turned off is represented by $t_0$, the carrier concentration is expressed by Formula 7.

$$\Delta p(t) = \Delta p(t_0) \exp\left(-\frac{t-t_0}{\tau_p}\right) (t \geq t_0) \quad \text{[Formula 7]}$$

Since the photoelectric current is in proportion to the excess carrier concentration, the current formula is expressed by Formula 8.

$$I(t) = \begin{cases} I_0\left[1 - \exp\left(-\frac{t}{\tau_p}\right)\right] (0 \leq t \leq t_0) \\ I_0\left[1 - \exp\left(-\frac{t_0}{\tau_p}\right)\right] \exp\left(-\frac{t-t_0}{\tau_p}\right) (t \geq t_0) \end{cases} \quad \text{[Formula 8]}$$

($I_0$ depends on constant, physical property, and structure.)

The relaxation time $\tau$ depends on a model of carrier recombination. There are many types of recombination processes. Basically, two types of processes, direct recombination and indirect recombination (SRH recombination), can be given.

Further, for example, some traps can capture a hole but cannot easily capture an electron, where recombination hardly occurs. Such a trap is called a "safe" trap in this specification.

Figure 6A:
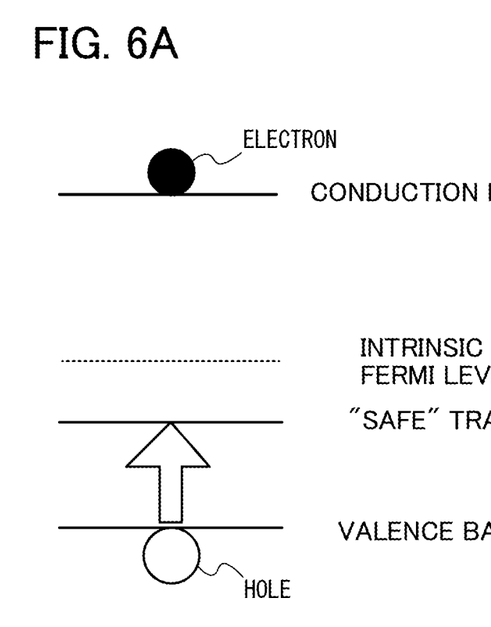
FIGS. 6A and 6B are schematic diagrams of a "safe" trap.
Figure 6B:
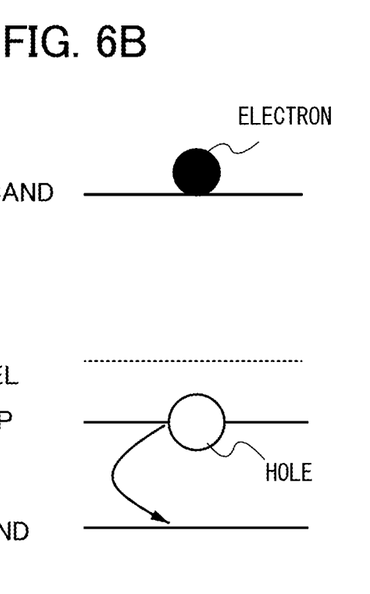

FIG. 6A is a schematic diagram of the "safe" trap. FIG. 6B is a schematic diagram showing a transition due to heat after trapping.

Since the position of the "safe" trap is closer to the valence band than the intrinsic Fermi level and an electron is not easily captured by the "safe" trap, part of holes captured by the "safe" traps are transferred to the valence band by heat and thus contribute to electric conduction. A semiconductor in which the "safe" traps exist exhibits two kinds of modes in photoresponse.

According to an embodiment of the present invention disclosed in this specification, an oxide semiconductor layer which exhibits two kinds of modes in photoresponse is used, whereby a transistor in which light deterioration is suppressed to the minimum and the electric characteristics are stable is achieved. Note that the oxide semiconductor layer which exhibits two kinds of modes in photoresponse has a photoelectric current value of greater than or equal to 1 pA, preferably greater than or equal to 10 pA and less than or equal to 10 nA. In addition, in the oxide semiconductor layer, a photoelectric current value after 100 seconds of light irradiation is greater than or equal to 400 aA/μm and less than or equal to 0.1 pA/μm at 25° C. and light deterioration can be suppressed to the minimum.

When the average time $\tau_1$ until which carriers are captured by "safe" traps is large enough, there are two kinds of modes in photoresponse, that is, a region where the current value falls rapidly and a region where the current value falls gradually, in the result of a change in photoelectric current over time.

In consideration of the "safe" trap, the current formula after $\tau_1$ (when almost all excess carriers are captured by the "safe" traps) is expressed by Formula 9. Note that $\tau_2$ represents average time during which carriers stay at the "safe" traps.

$$I(t) = A\tau_p\left(\frac{D_e}{D_h} \cdot \frac{\tau_2}{\tau_1}\right) \exp\left(-\frac{t}{\tau_2}\right) (t \geq \tau_1) \quad \text{[Formula 9]}$$

A: constant depending on physical property or temperature
$D_e$, $D_h$: diffusion coefficient of electron and diffusion coefficient of hole
$\tau_p$: relaxation time of hole in thermal equilibrium Estimation of trap levels corresponding to $\tau_1$ and $\tau_2$ leads to evaluation of defects. Such a method for evaluation with the use of $\tau_1$ and $\tau_2$ is referred to as a photoresponse defect evaluation method (PDEM).

A liquid crystal display device in which a transistor including an oxide semiconductor is provided in a pixel has high reliability with respect to light deterioration.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details thereof can be modified in various ways. Therefore, the present invention is not construed as being limited to the description of the embodiments.

Embodiment 1

In this embodiment, a TEG was manufactured with the use of an oxide semiconductor. With the use of the TEG, the photoresponse characteristics of the oxide semiconductor before and after irradiation with light (luminance: 17000 cd/cm$^2$) for 600 seconds were measured. By using the result thereof, a graph of the photoresponse characteristics (a graph showing time dependence of photoelectric current) is made.

Figure 7A:
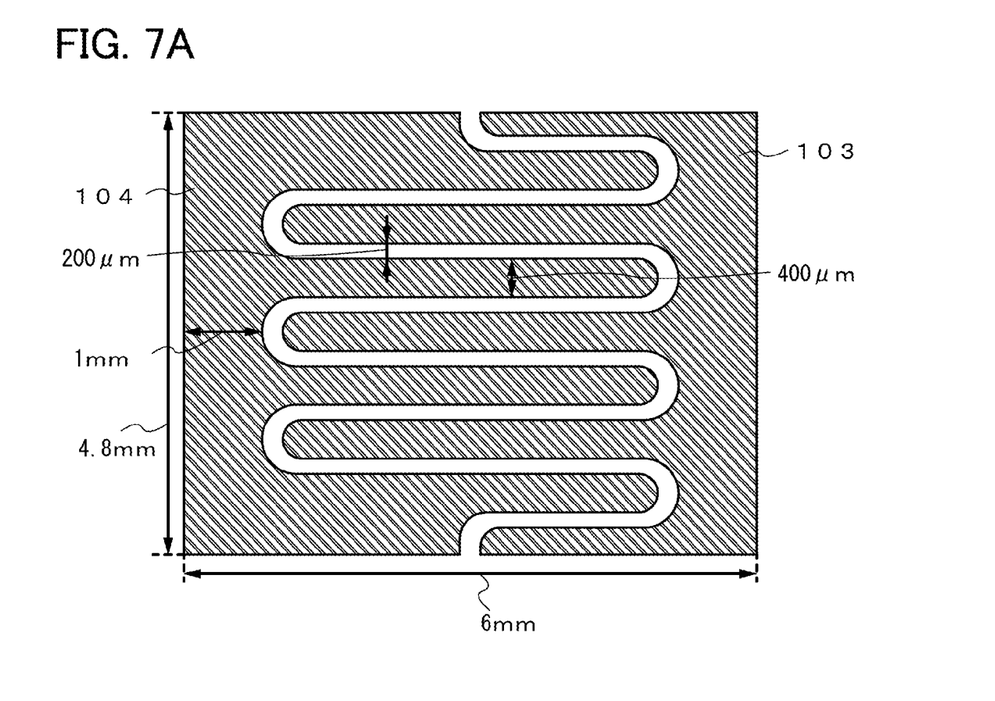
FIG. 7A is a top view of an electrode and FIG. 7B is a cross-sectional view illustrating the structure of a TEG.
Figure 7B:
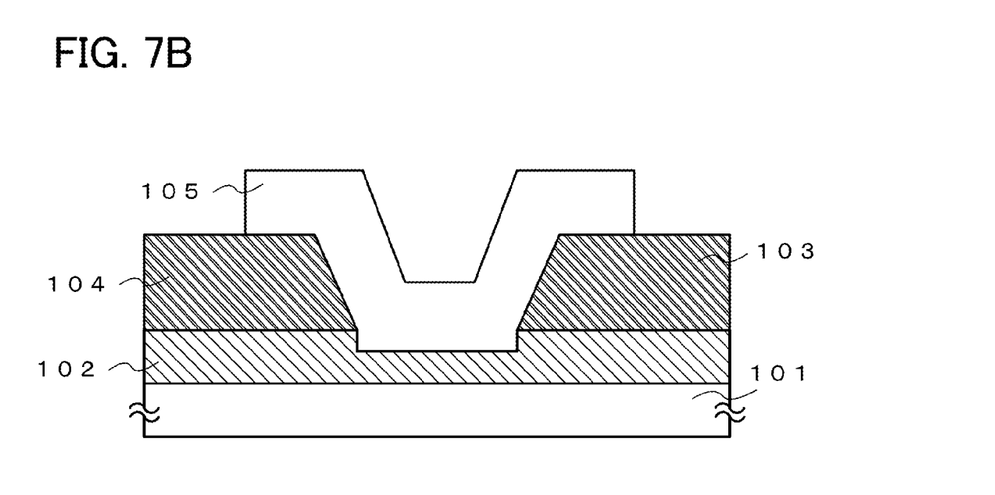

The structure of the TEG used for evaluation is as follows: the channel length (L) is 200 μm, the channel width (IF) is 2.09 cm, the thickness of a thick portion of an In—Ga—Zn—O film is 50 nm, and the thickness of a thin portion of the In—Ga—Zn—O film is 25 nm. The cross-sectional structure of this TEG is illustrated in FIG. 7B. In FIG. 7B, an In—Ga—Zn—O film 102 is formed over a glass substrate 101, and a first electrode 103 and a second electrode 104 are formed over the In—Ga—Zn—O film 102. FIG. 7A illustrates the top shapes of the first electrode 103 and the second electrode 104. The space between the first electrode 103 and the second electrode 104 is 200 and a region of the In—Ga—Zn—O film 102 which overlaps with the region between the first electrode 103 and the second electrode 104 is 25 nm, which is thinner than a region overlapping with the first electrode 103 or the second electrode 104 as illustrated in FIG. 7B. In addition, an insulating layer 105 is formed over the first electrode 103 and the second electrode 104 so as to prevent the In—Ga—Zn—O film 102 from being exposed.

Figure 9:
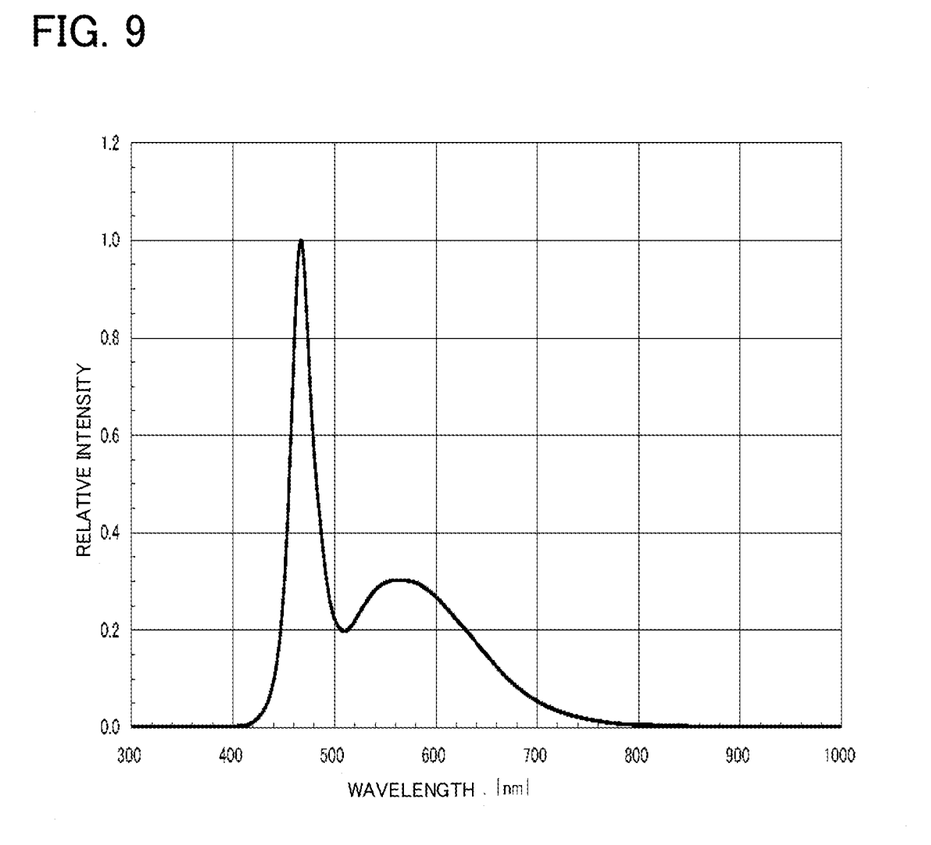
FIG. 9 is a graph showing the emission spectrum of a white LED.

A white LED (MDBL-CW100 produced by Moritex Corporation) was used as a light source for emitting light with which the In—Ga—Zn—O film 102 was irradiated. The emission spectrum of this white LED is shown in FIG. 9.

In order to observe the temperature characteristics, three samples were manufactured and the temperature characteristics were measured at 25° C., 85° C., and 150° C. by using the three samples. The manufacturing process of the three samples will be described below.

An In—Ga—Zn—O film is formed to a thickness of 50 nm by a sputtering method with the use of an oxide target having a composition ratio of $In_2O_3:Ga_2O_3:ZnO=1:1:1$ [molar ratio] over a glass substrate (126.6 mm×126.6 mm). The film formation conditions of the In—Ga—Zn—O film are as follows: the film formation temperature is room temperature, the flow of argon is 10 sccm, the flow of oxygen is 5 sccm, the pressure is 0.4 Pa, and the power is 500 W.

Then, heat treatment is performed at 450° C. for 1 hour in a nitrogen atmosphere. This heat treatment is preferably performed in an atmosphere of nitrogen or a rare gas such as helium, neon, or argon in which water, hydrogen, or the like is not contained, for example, the dew point is lower than or equal to −40° C., preferably lower than or equal to −60° C. It is preferable that the purity of nitrogen or a rare gas such as helium, neon, or argon which is introduced into a heat treatment apparatus be set to be greater than or equal to 6N (99.9999%), preferably greater than or equal to 7N (99.99999%) (that is, the impurity concentration is less than or equal to 1 ppm, preferably less than or equal to 0.1 ppm).

After the heat treatment, a layered conductive film is formed by stacking a titanium nitride film with a thickness of 50 nm, a titanium film with a thickness of 50 nm, an aluminum film with a thickness of 200 nm, and a titanium film with a thickness of 50 nm by a sputtering method.

A resist mask is formed over the layered conductive film through a photolithography step, and etching is performed selectively to form the first electrode 103 and the second electrode 104. After that, $O_2$ ashing is performed, whereby a part of the In—Ga—Zn—O film which is exposed is thinned to 25 nm, and then, the resist mask is removed.

Next, by a sputtering method with the use of a silicon oxide target, a silicon oxide film with a thickness of 300 nm is formed over the first electrode 103 and the second electrode 104.

Then, a resist mask is formed over the silicon oxide film through a photolithography step, and etching is performed selectively to form the insulating layer 105. After that, heat treatment is performed at 250° C. for 1 hour in a nitrogen atmosphere.

Figure 1:
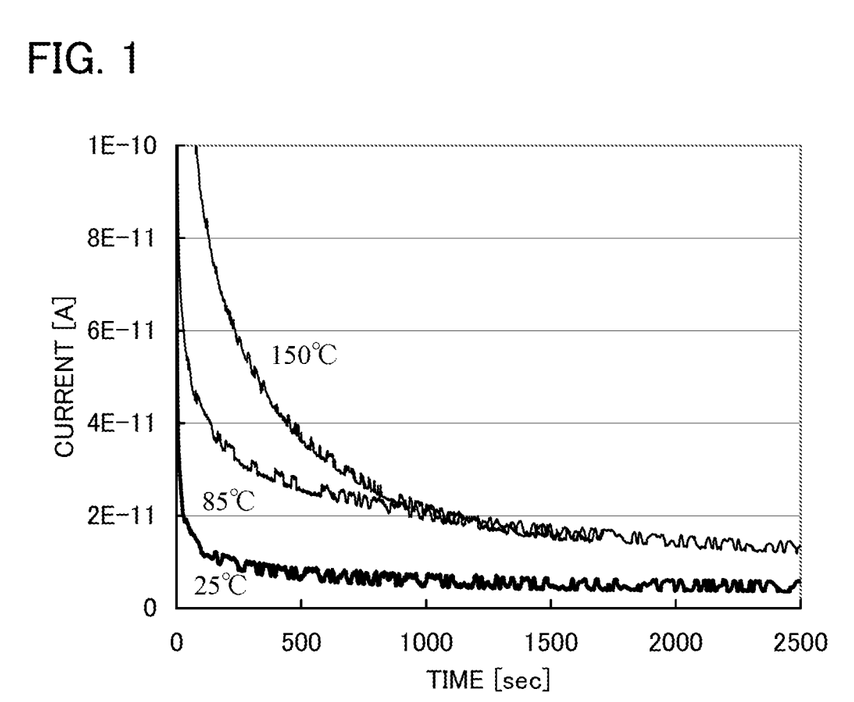
FIG. 1 is a graph showing photoresponse characteristics of oxide semiconductor layers.
Figure 2:
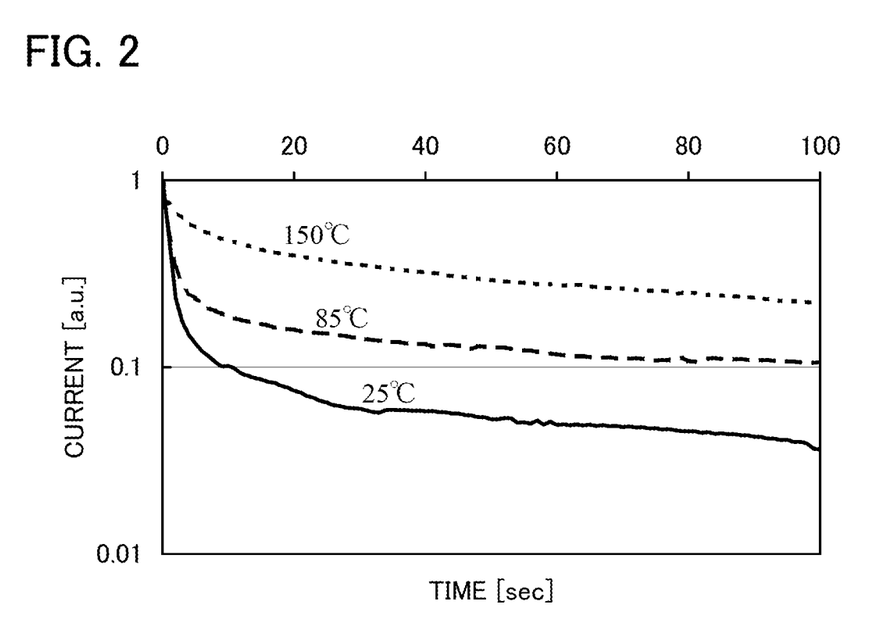
FIG. 2 is a graph enlarging a region in the range of 0 sec to 100 sec in FIG. 1.

Finally, the glass substrate is divided into a plurality of pieces such that one TEG is placed in each piece having an area of 10 mm×10 mm. After irradiation with white light having a luminance of 17000 cd/cm² for 600 seconds, measurement was performed by setting the time right after the light source is turned off to 0. FIG. 1 is a graph showing the photoresponse characteristics of oxide semiconductor layers. In FIG. 1, the horizontal axis indicates time and the vertical axis indicates a current value. The light source is turned off at time 0. FIG. 2 is a graph enlarging a region in the range of 0 sec to 100 sec in FIG. 1.

Table 1 is a list showing numerical values in FIG. 1. A photoelectric current value per micrometer shown in Table 1 was obtained by calculation. The photoelectric current value per micrometer after 100 seconds of irradiation of the oxide semiconductor layer with light at 25° C. was found to be 593 pA/μm.

TABLE 1

| Measurement Temperature | 0 sec (A) | 10 sec (A) | 100 sec (A) | 500 sec (A) | 1000 sec (A) | Ioff per micrometer after 100 sec (A) |
|---|---|---|---|---|---|---|
| 25° C. | 3.27E−10 | 3.33E−11 | 1.19E−11 | 6.31E−12 | 5.51E−12 | 5.93E−14 |
| 85° C. | 4.14E−10 | 7.84E−11 | 4.4E−11 | 2.56E−11 | 2.123E−11 | 2.202E−13 |
| 150° C. | 7.86E−10 | 1.95E−10 | 8.84E−11 | 3.61E−11 | 2.027E−11 | 4.422E−13 |

Other TEGs were manufactured under conditions partly different from those of the above three samples. The film formation conditions of the In—Ga—Zn—O film of a fourth sample and a fifth sample are as follows: the film formation temperature is room temperature, the flow of argon is 10.5 sccm, the flow of oxygen is 4.5 sccm, and the power is 100 W. Note that other film formation conditions and the film thickness are the same as the above three samples.

The fourth sample was subjected to heat treatment at 650° C. for 1 hour in a nitrogen atmosphere. The fifth sample was subjected to heat treatment at 650° C. for 1 hour in a nitrogen atmosphere and then heat treatment at 450° C. for 1 hour in an atmosphere containing oxygen and nitrogen.

The steps after the heat treatment are performed in the same manner as the above three samples, so that the TEGs were manufactured.

Figure 3:
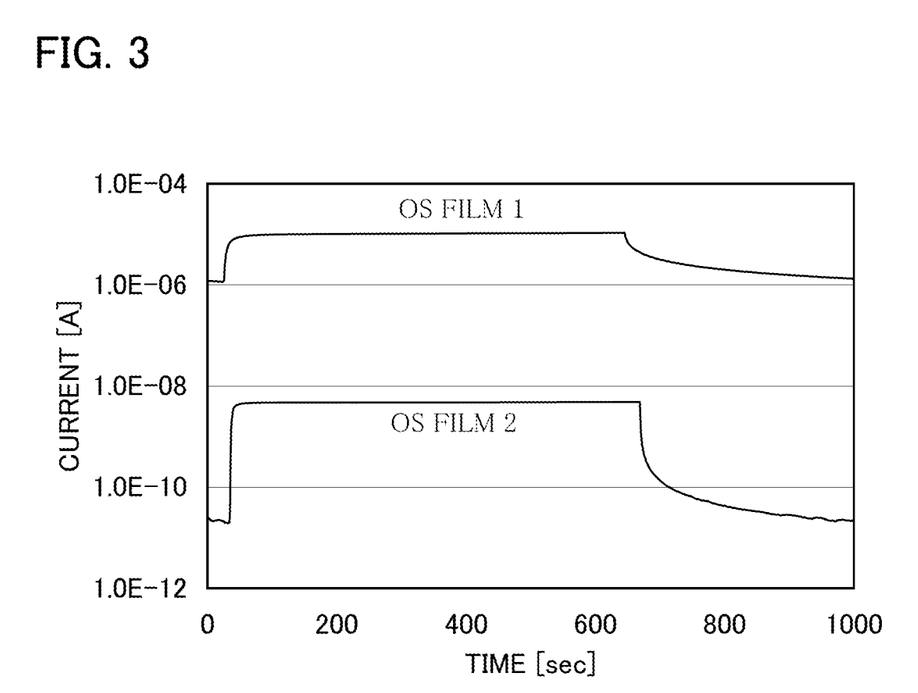
FIG. 3 is a graph showing photoresponse characteristics of oxide semiconductor layers with the use of a logarithmic scale.
Figure 4:
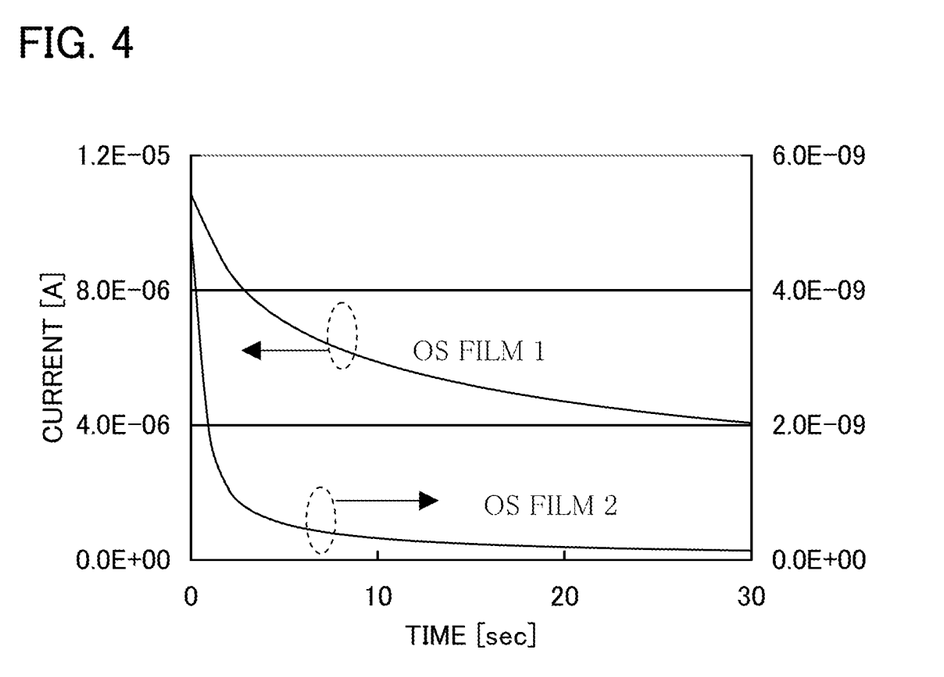
FIG. 4 is a graph showing photoresponse characteristics of oxide semiconductor layers with the use of a linear scale.

After irradiation with white light having a luminance of 17000 cd/cm² for 600 seconds, the photoresponse characteristics after the light source was turned off were measured. The result of measuring the photoresponse characteristics of the fourth sample is expressed by "OS film 1", and the result of measuring the photoresponse characteristics of the fifth sample is expressed by "OS film 2", which are shown in FIG. 3 with the use of a logarithmic scale. In addition, after irradiation with white light having a luminance of 17000 cd/cm² for 600 seconds, the light source was turned off and time right after the light source was turned off was set to 0. The result of measuring the photoresponse characteristics under this condition is shown in FIG. 4 with the use of a linear scale. According to FIG. 3 and FIG. 4, a single-layer oxide semiconductor film (OS film 1) formed using a metal oxide which was used as a comparative example has a photoelectric current value of about greater than or equal to 1 μA and less than or equal to 10 μA. On the other hand, a single-layer oxide semiconductor film (OS film 2) of this embodiment has a photoelectric current value of about greater than or equal to 10 pA and less than or equal to 10 nA. In the case of the single-layer oxide semiconductor film (OS film 2) of this embodiment, the rise and the fall of the photoresponse characteristics are sharp, and the current value is very small. Also in the case of using light having a wavelength of 350 nm, which is considered to have an energy that is greater than or equal to the band gap, a tendency similar to the above is observed.

Figure 5:
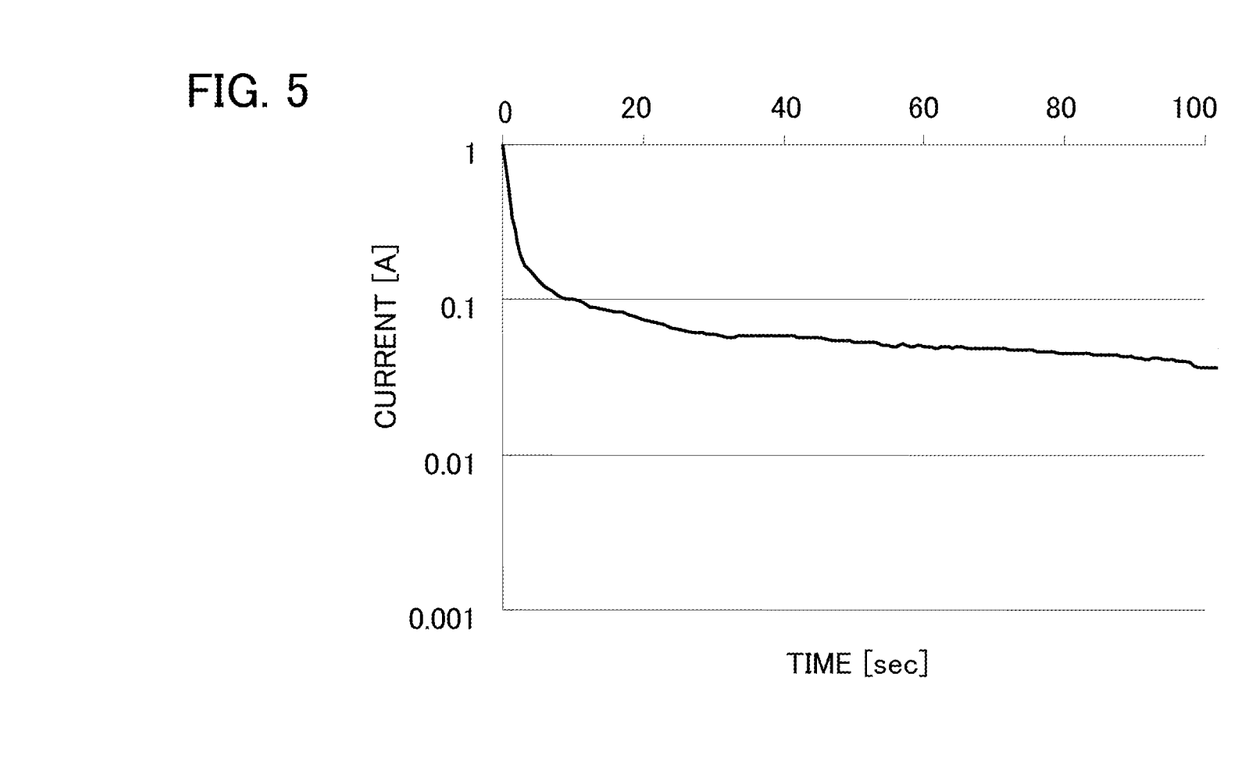
FIG. 5 is a graph for showing a method for estimating $\tau_1$ with the use of data in FIG. 2.

Fitting of $\tau_2$ can be performed using the current formula expressed by Formula 9. A region in the range of 20 sec to 100 sec in FIG. 2 which is a graph using a logarithmic scale was plotted with the use of a linear scale, and fitting was performed. FIG. 5 shows a method for estimating $\tau_1$.

Since the temporal resolution is 1 [sec], sharpness around time 0 [sec] right after the light source is turned off cannot be correctly measured, and $\tau_1$ might be estimated to be larger than the real value. Table 2 shows $\tau_1$ and $\tau_2$ at following temperatures.

of the oxide semiconductor layer with light, a photoelectric current value per micrometer of channel length is 97.7 fA/μm. In the TEG in which the channel length (L) is 100 μm, after 100 seconds of irradiation of the oxide semiconductor layer with light, a photoelectric current value per micrometer of channel length is 42.5 fA/μm. In the TEG in which the channel length (L) is 200 μm, after 100 seconds of irradiation of the oxide semiconductor layer with light, a photoelectric current value per micrometer of channel length is 13.7 fA/μm. In the TEG in which the channel length (L) is 500 μm, after 100 seconds of irradiation of the oxide semiconductor layer with light, a photoelectric current value per micrometer of channel length is 413 aA/μm. As described above, at 25° C., the oxide semiconductor layer has a photoelectric current value of greater than or equal to 400 aA/μm and less than or equal to 0.1 pA/μm after 100 seconds of light irradiation, which means that light deterioration is suppressed to the minimum. Therefore, a transistor whose electric characteristics are stable can be achieved by using the oxide semiconductor layer.

TABLE 3

| L (μm) | Ion (A) | Ioff after 1 sec (A) | Ioff after 10 sec (A) | Ioff after 100 sec (A) | Ioff per micrometer after 100 sec (A) |
| --- | --- | --- | --- | --- | --- |
| 50 | 3.2704E−08 | 6.707E−11 | 1.39891E−11 | 4.88727E−12 | 9.77455E−14 |
| 100 | 2.19308E−08 | 9.256E−11 | 1.28518E−11 | 4.24727E−12 | 4.24727E−14 |
| 200 | 7.1513E−09 | 9.15E−12 | 2.19636E−12 | 2.73364E−12 | 1.36682E−14 |
| 500 | 1.7527E−09 | 2.34E−12 | 1.25455E−12 | 2.06364E−13 | 4.12727E−16 |

|  | 25° C. | 85° C. | 150° C. |
| --- | --- | --- | --- |
| $\tau_1$ [sec] | 2.3 | 1.6 | 1.5 |
| $\tau_2$ [sec] | 350 | 480 | 340 |

Since $\tau_1$ can be regarded as substantially the same at all temperatures in consideration of the temporal resolution for measurement, $\tau_2$ does not depend on the temperature, either. This is because $\tau_1$ and $\tau_2$ depend on the trap density. On the other hand, according to FIG. 2, as the temperature is higher, the rate of reduction in current is small. This is because the probability of thermal excitation from the traps is higher as the temperature is higher.

The curve showing the photoresponse characteristics has two kinds of modes because "safe" traps exist around the conduction band or the valence band. When fitting is performed to obtain the rapid relaxation time $\tau_1$ and the gradual relaxation time $\tau_2$, it is found that these two kinds of relaxation time ($\tau_1$ and $\tau_2$) less depend on the temperature but depend on the trap density, and it can be said from the temperature dependence of reduction in current that the traps exist at very shallow levels.

The channel length was varied, and the measurement was performed under the conditions shown in Table 1. The structures of the TEGs used for evaluation are as follows: the channel length (L) was set to 50 μm, 100 μm, and 200 μm in respective TEGs, and the channel width (IF) was set to 2.09 cm. The measurement results are shown in Table 3. Note that the measurement temperature is 25° C. A photoelectric current value per micrometer was obtained by calculation and shown in Table 3. In the TEG in which the channel length (L) is 50 μm, after 100 seconds of irradiation In this embodiment, a TEG is shown as an example, but the present invention is not limited thereto. For example, in a transistor including the same oxide semiconductor, light deterioration can be suppressed to the minimum and the electric characteristics can be stable. In addition, a liquid crystal display device in which a transistor including the same oxide semiconductor is provided in a pixel has high reliability with respect to light deterioration.

Embodiment 2

In this embodiment, an example of a transistor that can be applied to a liquid crystal display device disclosed in this specification will be described. There is no particular limitation on the structure of a transistor which can be applied to a liquid crystal display device disclosed in this specification. For example, a staggered type and a planar type of a top-gate structure or a bottom-gate structure can be used. Further, the transistor may have a single gate structure including one channel formation region, a double gate structure including two channel formation regions, or a triple gate structure including three channel formation regions. Alternatively, the transistor may have a dual gate structure including two gate electrode layers positioned over and below a channel region with a gate insulating layer provided therebetween. FIGS. 8A to 8D each illustrate an example of the cross-sectional structure of a transistor. The transistors illustrated in FIGS. 8A to 8D each include an oxide semiconductor as a semiconductor. An advantage of using an oxide semiconductor is that high mobility and low off-state current can be obtained through a relatively easy and low-temperature process.

Figure 8A:
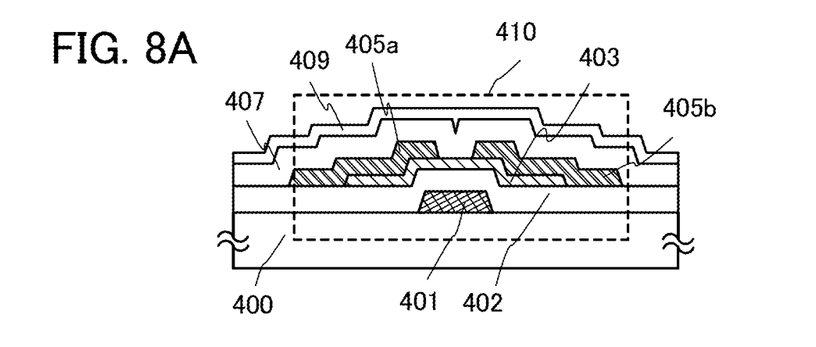
FIGS. 8A to 8D are cross-sectional views each illustrating the structure of a transistor.

A transistor 410 illustrated in FIG. 8A is a kind of bottom-gate thin film transistor, and is also referred to as an inverted-staggered thin film transistor.

The transistor 410 includes, over a substrate 400 having an insulating surface, a gate electrode layer 401, a gate insulating layer 402, an oxide semiconductor layer 403, a source electrode layer 405a, and a drain electrode layer 405b. Further, an insulating layer 407 stacked over the oxide semiconductor layer 403 is provided so as to cover the transistor 410. A protective insulating layer 409 is formed over the insulating layer 407.

The insulating layer 407 is in contact with the oxide semiconductor layer 403 and can be formed using a material such as GaOx (x>0), SiOx (x>0), or nitride (except for titanium nitride). In particular, when GaOx is used, the insulating layer 407 can function as a film for preventing electrification of a back channel.

Figure 8B:
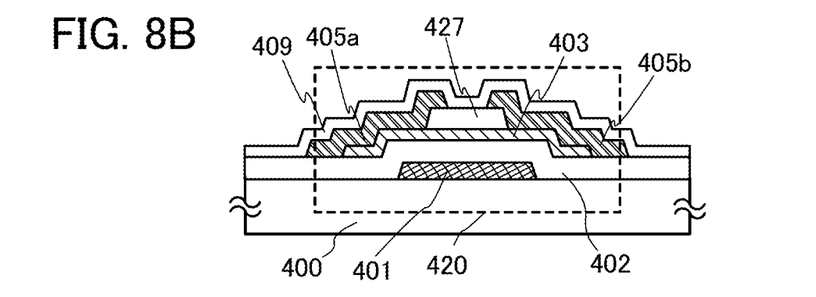

A transistor 420 illustrated in FIG. 8B has a kind of bottom-gate structure referred to as a channel-protective type (channel-stop type) and is also referred to as an inverted-staggered thin film transistor.

The transistor 420 includes, over a substrate 400 having an insulating surface, a gate electrode layer 401, a gate insulating layer 402, an oxide semiconductor layer 403, an insulating layer 427 which functions as a channel protective layer covering a channel formation region of the oxide semiconductor layer 403, a source electrode layer 405a, and a drain electrode layer 405b. Further, a protective insulating layer 409 is formed so as to cover the transistor 420.

Figure 8C:
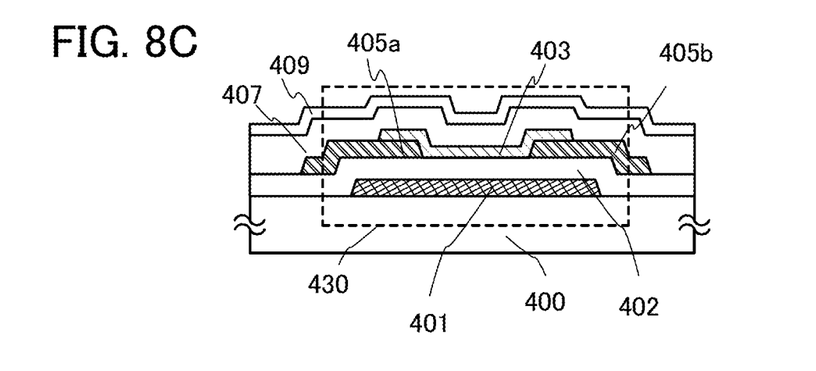

A transistor 430 illustrated in FIG. 8C is a bottom-gate thin film transistor and includes, over a substrate 400 which is a substrate having an insulating surface, a gate electrode layer 401, a gate insulating layer 402, a source electrode layer 405a, a drain electrode layer 405b, and an oxide semiconductor layer 403. Further, an insulating layer 407 being in contact with the oxide semiconductor layer 403 is provided so as to cover the transistor 430. A protective insulating layer 409 is formed over the insulating layer 407.

In the transistor 430, the gate insulating layer 402 is provided on and in contact with the substrate 400 and the gate electrode layer 401, and the source electrode layer 405a and the drain electrode layer 405b are provided on and in contact with the gate insulating layer 402. Further, the oxide semiconductor layer 403 is provided over the gate insulating layer 402, the source electrode layer 405a, and the drain electrode layer 405b.

Figure 8D:
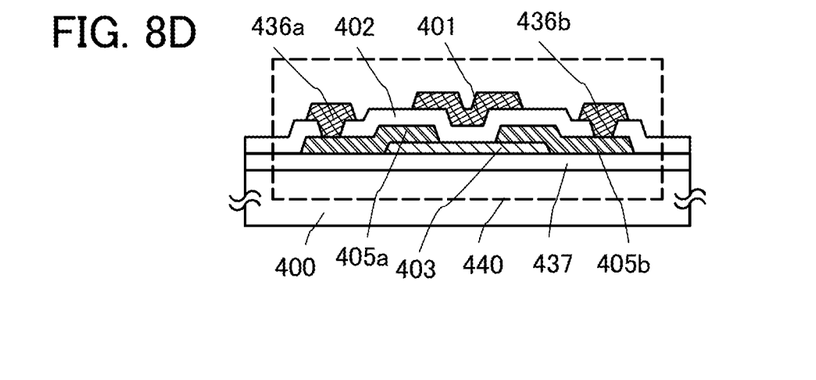

A transistor 440 illustrated in FIG. 8D is a kind of top-gate thin film transistor. The transistor 440 includes, over a substrate 400 having an insulating surface, an insulating layer 437, an oxide semiconductor layer 403, a source electrode layer 405a, a drain electrode layer 405b, a gate insulating layer 402, and a gate electrode layer 401. A wiring layer 436a and a wiring layer 436b are provided in contact with and electrically connected to the source electrode layer 405a and the drain electrode layer 405b, respectively.

In this embodiment, as described above, the oxide semiconductor layer 403 is used as a semiconductor layer. As an oxide semiconductor used for the oxide semiconductor layer 403, a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Ga—O-based oxide semiconductor, or an In—Mg—O-based oxide semiconductor; or an In—O-based oxide semiconductor layer, a Sn—O-based oxide semiconductor, or a Zn—O-based oxide semiconductor, or the like can be used. Further, $SiO_2$ may be contained in the above oxide semiconductor. Here, for example, the In—Ga—Zn—O-based oxide semiconductor means an oxide containing at least In, Ga, and Zn, and the composition ratio of the elements is not particularly limited. The In—Ga—Zn—O-based oxide semiconductor may contain an element other than In, Ga, and Zn.

In addition, as the oxide semiconductor layer 403, a thin film of a material represented by a chemical formula, $InMO_3(ZnO)_m$ (m>0), can be used. Here, M represents one or more metal elements selected from Ga, Al, Mn, and Co. For example, M can be Ga, Ga and Al, Ga and Mn, Ga and Co, or the like.

In the case where an In—Zn—O-based material is used as the oxide semiconductor, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=15:1 to 1.5:1 in an atomic ratio ($In_2O_3$:ZnO=15:2 to 3:4 in a molar ratio). For example, when a target used for forming the In—Zn—O-based oxide semiconductor has a composition ratio of In:Zn:O=X:Y:Z in an atomic ratio, Z>(1.5X+Y).

The oxide semiconductor layer 403 in each of the transistors 410, 420, 430, and 440 is preferably heated at a temperature of higher than or equal to 450° C. in an atmosphere which does not contain moisture and hydrogen. For example, heat treatment is performed at 650° C. for 1 hour in a nitrogen atmosphere and then heat treatment is performed at 450° C. for 1 hour in an atmosphere containing nitrogen and oxygen. The heat treatment may be performed with the use of ultra-dry air (in which the dew point is lower than or equal to −40° C., preferably lower than or equal to −60° C.) as an atmosphere containing nitrogen and oxygen. With this heat treatment, light deterioration can be suppressed to the minimum, and a transistor whose electric characteristics are stable can be provided.

In the transistors 410, 420, 430, and 440 each including the oxide semiconductor layer 403, the amount of current in an off state (off-state current) can be small. Therefore, by using the transistor including the oxide semiconductor layer 403 in a pixel portion of a liquid crystal display device, an electric signal such as image data can be held for a longer period and a writing interval can be set longer. Accordingly, frequency of refresh operation can be reduced, which leads to an effect of suppressing power consumption.

In addition, the transistors 410, 420, 430, and 440 each including the oxide semiconductor layer 403 can have relatively high field-effect mobility and thus can operate at high speed. Therefore, by using any of the above transistors in a pixel portion of a liquid crystal display device, a high-quality image can be provided. In addition, since a driver circuit portion and the pixel portion can be manufactured over one substrate with the use of the transistor including the oxide semiconductor layer 403, the number of components of the liquid crystal display device can be reduced.

Although there is no particular limitation on a substrate that can be used as the substrate 400 having an insulating surface, a glass substrate made of barium borosilicate glass, aluminoborosilicate glass, or the like can be used.

In the bottom-gate transistors 410, 420, and 430, an insulating film serving as a base film may be provided between the substrate and the gate electrode layer. The base film has a function of preventing diffusion of impurity elements from the substrate, and can be formed to have a single-layer structure or a layered structure using one or more of a silicon nitride film, a silicon oxide film, a silicon nitride oxide film, and a silicon oxynitride film.

The gate electrode layer 401 can be formed to have a single-layer structure or a layered structure using a metal material such as molybdenum, titanium, chromium, tantalum, tungsten, aluminum, copper, neodymium, or scandium, or an alloy material which contains any of these materials as its main component.

The gate insulating layer 402 can be formed with a single-layer structure or a layered structure using one or more of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like. For example, by a plasma CVD method, a silicon nitride layer ($SiN_y$ (y>0)) with a thickness of greater than or equal to 50 nm and less than or equal to 200 nm is formed as a first gate insulating layer, and a silicon oxide layer ($SiO_x$ (x>0)) with a thickness of greater than or equal to 5 nm and less than or equal to 300 nm is formed as a second gate insulating layer over the first gate insulating layer, so that a gate insulating layer with a total thickness of 200 nm is formed.

As a conductive film used for the source electrode layer 405a and the drain electrode layer 405b, for example, a film of an element selected from Al, Cr, Cu, Ta, Ti, Mo, and W, a film of an alloy containing any of these elements as its component, a film of an alloy containing any of these elements in combination, or the like can be used. The conductive film may have a structure in which a high-melting-point metal layer of Ti, Mo, W, or the like is stacked over and/or below a metal layer of Al, Cu, or the like. When an Al material to which an element (e.g., Si, Nd, or Sc) which prevents generation of hillocks and whiskers in an Al film is added is used, heat resistance can be increased.

A material similar to that for the source electrode layer 405a and the drain electrode layer 405b can be used for a conductive film used for the wiring layer 436a and the wiring layer 436b which are respectively connected to the source electrode layer 405a and the drain electrode layer 405b.

Alternatively, the conductive film used for the source electrode layer 405a and the drain electrode layer 405b (including a wiring layer formed using the same layer as the source electrode layer 405a and the drain electrode layer 405b) may be formed using a conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon oxide is contained can be used.

As the insulating layers 407, 427, and 437, an inorganic insulating film, typically, a silicon oxide film, a silicon oxynitride film, an aluminum oxide film, or an aluminum oxynitride film, can be used.

For the protective insulating layer 409, an inorganic insulating film such as a silicon nitride film, an aluminum nitride film, a silicon nitride oxide film, or an aluminum nitride oxide film can be used.

Further, a planarization insulating film may be formed over the protective insulating layer 409 so that surface roughness due to the transistor can be reduced. For the planarization insulating film, an organic material such as polyimide, acrylic, or benzocyclobutene can be used. Other than such organic materials, it is also possible to use a low-dielectric constant material (a low-k material) or the like. Alternatively, the planarization insulating film may be formed by stacking a plurality of insulating films formed from these materials.

As described above, in this embodiment, a high-performance liquid crystal display device can be provided by using the transistor including the oxide semiconductor layer.

This application is based on Japanese Patent Application serial no. 2010-064751 filed with Japan Patent Office on Mar. 19, 2010, the entire contents of which are hereby incorporated by reference.

What is claimed is:

1. A method for manufacturing a semiconductor device, comprising the steps of:
   forming a gate electrode over a substrate;
   forming a gate insulating layer over the gate electrode;
   forming an oxide semiconductor layer over the gate insulating layer;
   performing a first heat treatment on the oxide semiconductor layer at a temperature of 450° C. or higher in a nitrogen atmosphere; and
   performing a second heat treatment on the oxide semiconductor layer at a temperature of 450° C. or higher in an atmosphere containing nitrogen and oxygen,
   wherein photoresponse characteristics of the oxide semiconductor layer have two kinds of modes after light irradiation is performed and a light source is turned off, and
   wherein the oxide semiconductor layer has a photoelectric current value of greater than or equal to 1 pA and less than or equal to 10 nA when the light irradiation is performed.

2. The method for manufacturing a semiconductor device according to claim 1, wherein the oxide semiconductor layer comprises at least one of indium, zinc, and gallium.

3. The method for manufacturing a semiconductor device according to claim 1, wherein the two kinds of modes comprise a region where a photoelectric current value of the oxide semiconductor layer falls rapidly and a region where the photoelectric current value falls gradually, in a result of a change in photoelectric current over time.

4. The method for manufacturing a semiconductor device according to claim 1, further comprising the steps of:
   forming an insulating layer over the oxide semiconductor layer; and
   forming a source electrode and a drain electrode over and in contact with the oxide semiconductor layer and the insulating layer.

5. The method for manufacturing a semiconductor device according to claim 1, further comprising the steps of:
   forming a source electrode and a drain electrode over and in contact with the oxide semiconductor layer;
   forming a first insulating layer over the oxide semiconductor layer, the source electrode and the drain electrode; and
   forming a second insulating layer over the first insulating layer,
   wherein the first insulating layer comprising gallium, and oxide.

6. A method for manufacturing a semiconductor device, comprising the steps of:
- forming an oxide semiconductor layer over a substrate;
- performing a first heat treatment on the oxide semiconductor layer at a temperature of 450° C. or higher in a nitrogen atmosphere;
- performing a second heat treatment on the oxide semiconductor layer at a temperature of 450° C. or higher in an atmosphere containing nitrogen and oxygen;
- forming a source electrode and a drain electrode over and in contact with the oxide semiconductor layer;
- forming a gate insulating layer over the oxide semiconductor layer, the source electrode and the drain electrode; and
- forming a gate electrode over the gate insulating layer,
- wherein photoresponse characteristics of the oxide semiconductor layer have two kinds of modes after light irradiation is performed and a light source is turned off, and
- wherein the oxide semiconductor layer has a photoelectric current value of greater than or equal to 1 pA and less than or equal to 10 nA when the light irradiation is performed.

7. The method for manufacturing a semiconductor device according to claim 6, wherein the oxide semiconductor layer comprises at least one of indium, zinc, and gallium.

8. The method for manufacturing a semiconductor device according to claim 6, wherein the two kinds of modes comprise a region where a photoelectric current value of the oxide semiconductor layer falls rapidly and a region where the photoelectric current value falls gradually, in a result of a change in photoelectric current over time.

* * * * *